(12) United States Patent
Kang

(10) Patent No.: US 6,465,261 B2
(45) Date of Patent: Oct. 15, 2002

(54) METHOD FOR MANUFACTURING FERAM DEVICE

(75) Inventor: Eung-Youl Kang, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 22 days.

(21) Appl. No.: 09/739,447

(22) Filed: Dec. 19, 2000

(65) Prior Publication Data

US 2001/0024855 A1 Sep. 27, 2001

(30) Foreign Application Priority Data

Dec. 28, 1999 (KR) .............................. 99-63660

(51) Int. Cl.$^7$ .............................................. H01L 21/00
(52) U.S. Cl. ............................................ 438/3; 438/240
(58) Field of Search ............................ 438/3, 393, 396, 438/210, 240

(56) References Cited

U.S. PATENT DOCUMENTS

| | | | | |
|---|---|---|---|---|
| 6,015,990 A | * | 1/2000 | Hieda et al. | 257/295 |
| 6,184,927 B1 | * | 2/2001 | Kang | 348/240 |
| 6,190,925 B1 | * | 2/2001 | Li et al. | 438/3 |
| 6,265,230 B1 | * | 7/2001 | Aggarwal et al. | 438/3 |

* cited by examiner

Primary Examiner—Kevin M. Picardat
(74) Attorney, Agent, or Firm—Jacobson Holman, PLLC

(57) ABSTRACT

A method for manufacturing a ferroelectric random access memory (FeRAM) device, the method including the steps of forming a unit die including a transistor and a capacitor on a semiconductor substrate, testing a wafer level function for the unit die, annealing the device above Curie temperature of ferroelectric material, and carrying out a package process for the device.

7 Claims, 2 Drawing Sheets

METHOD FOR MANUFACTURING FERAM DEVICE

FIELD OF THE INVENTION

The present invention relates to a method for manufacturing a semiconductor device; and, more particularly, to the method for manufacturing a ferroelectric random access memory (FeRAM) device to prevent the device from damage induced by a package process by applying an annealing process before the package process.

DESCRIPTION OF THE PRIOR ART

With the recent progress in film deposition techniques, applications of a nonvolatile memory cell using a ferroelectric thin film have increasingly been developed. This nonvolatile memory cell is a high-speed rewritable nonvolatile memory cell utilizing the high-speed polarization/inversion and the residual polarization of the ferroelectric capacitor thin film.

Therefore, a ferroelectric random access memory (FeRAM) where a capacitor thin film with ferroelectric properties such as strontium bismuth tantalate (SBT) and lead zirconate titanate (PZT) is increasingly used for a capacitor in place of a conventional silicon oxide film or a silicon nitride film, because it assures a low-voltage and high-speed performance, and does not require periodic refresh to prevent loss of information during standby intervals like a dynamic random access memory (DRAM).

Since a ferroelectric material has a dielectric constant ranging from hundreds to thousands value and stabilized residual polarization property at room temperature, it is being applied to the non-volatile memory device as the capacitor thin film. In case of employing the ferroelectric capacitor thin film in the non-volatile memory device, information data are stored by polarization of dipoles when an electric field is applied thereto. Even if the electric field is removed, the residual polarization remains so that the information data, i.e., "0" or "1", can be stored.

However, there are reliability problems for utilizing FeRAM as a memory device despite the fact that FeRAM has several advantages as aforementioned. Generally, there are two kinds of reliability problems in FeRAM, one of which is a fatigue problem and the other is a retention problem. The fatigue problem is related to how many times it preserves the data during repeated reading out and writing of the data, and the retention problem is related to how long it preserves the stored data.

To address the reliability problem of fatigue, attempts are made to use iridium oxide ($IrO_2$) or ruthenium oxide ($RuO_2$) as an electrode instead of platinum (Pt) when PZT is used as the capacitor thin film. Meanwhile, in case of using SBT as the capacitor thin film, a Pt electrode can be still available which shows improved property against the fatigue problem. Thus, the reliability problem related to fatigue of the memory device has been overcome to a considerable degree, i.e., $10^{10} \sim 10^{13}$ cycles.

However, the second reliability problem of retention still remains as a serious matter. If the fabricated device is left alone for a long time after writing information data of "0" or "1", a critical voltage is changed so that the stored data can hardly be read out with accuracy. In addition, if the device is exposed to high temperature for long time, the device characteristic is more deteriorated than in room temperature. For example, if a package process is carried out for the fabricated FeRAM device after a wafer level function test, the FeRAM experiences high thermal budget so that a pass rate of the device decreases eventually, because this package process is performed at high temperature for long time.

Especially, a post mold curing (PMC) process for curing the molding compound implicates the retention problem, where the process is carried out at 150~175° C. for 5~6 hours.

In more detail, after completing the fabrication of the FeRAM device, the wafer level function test is carried out to identify the defective device. However, after this test, the memory cells have one of the data, "0" or "1". This means that domains in the ferroelectric capacitor thin film are arrayed in predetermined orientations to generate an electric field. Therefore, when the package process is carried out at high temperatures for a long time, providing that the domains are arrayed in the predetermined orientations, mobile defects easily move toward grain boundaries due to the electric field so that charge distributions at the grain boundaries get changed. This change of the charge distributions results in critical voltage shift, e.g., decrease or increase, and further this change brings a decrease of residual polarization, whereby the device eventually fails.

In other words, if the package process is performed after wafer level function test, the dipoles being oriented in the predetermined direction, the pass rate of the FeRAM device after the package process decreases more than that after the wafer level function test. Thus, the reliability problem of retention represents an obstacle for applying the FeRAM device as a memory device.

SUMMARY OF THE INVENTION

It is, therefore, an object of the present invention to provide a method for manufacturing a ferroelectric random access memory (FeRAM) device to prevent deterioration thereof by applying an annealing treatment.

In accordance with one aspect of the present invention, there is provided a method for manufacturing a ferroelectric random access memory (FeRAM) device, the method comprising the steps of: a) forming a unit die including a transistor and a capacitor on a semiconductor substrate; b) testing a wafer level function for the unit die; c) annealing the device above Curie temperature of ferroelectric material; and d) carrying out a package process for the device.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
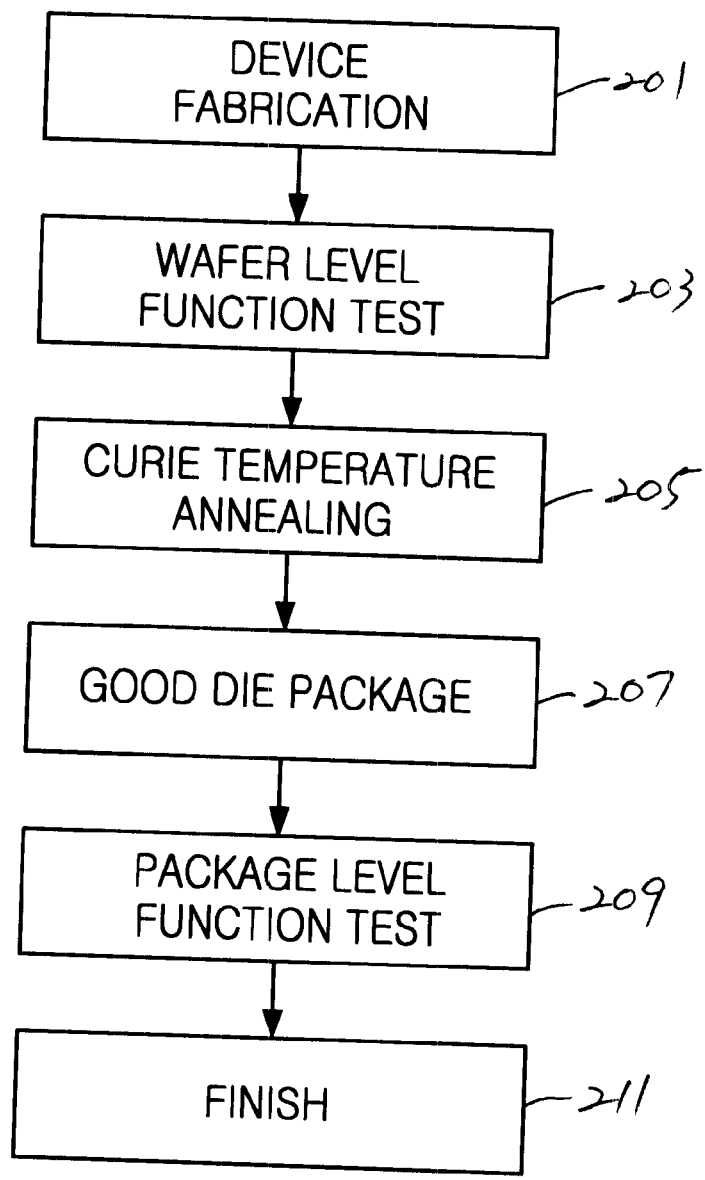
FIG. 1 is a flowchart setting forth a method for manufacturing a ferroelectric random access memory (FeRAM) in accordance with a preferred embodiment of the present invention.

Referring to FIG. 1, there is provided a process chart for manufacturing a ferroelectric random access memory (FeRAM). To begin, after the memory devices have been completely fabricated on a wafer, step 201, a wafer level function test is performed, step 203, for identifying defective devices. That is, the wafer level function test detects defective memory cells by connecting detection probes to input/output terminals of the test circuit on the wafer. After this test, defective chips may be discarded or, in some cases, repaired on the wafer.

In a next process, an annealing process is carried out above a Curie temperature (Tc), step 205, for getting rid of ferroelectricity of a ferroelectric capacitor thin film. The annealing process may be carried out in an inert gas ambient or in atmosphere by using a method such as a rapid thermal anneal (RTA) or in thermal anneal in a furnace. If the temperature rises above Tc, the ferroelectric thin film loses its ferroelectricity, i.e., has paraelectricity. On the contrary, if the temperature is lower than Tc, the ferroelectric material recovers its ferroelectricity again.

In more detail, the ferroelectric has a tetragonal crystal structure at room temperature so that this structure has polarization characteristic. But, above critical temperature, i.e., Curie temperature, the phase transformation occurs. That is, the tetragonal crystal structure is changed into a cubic crystal structure so that polarization characteristic disappears. Generally, the Curie temperature of ferroelectric materials for use in FeRAM devices ranges from 250° C. to 500° C. For example, Curie temperatures of PZT (PbZrTiO$_x$) and SBT (SrBiTaO$_x$) range from 350° C. to 500° C. and from 250° C. to 400° C. respectively.

In the case of lowering the temperature below Tc again, the cubic structure is changed into the tetragonal crystal structure so that paraelectricity is changed back into ferroelectricity. But, it is noted that in this state, the ferroelectric material has lost its experience, i.e., ferroelectricity before the annealing process. Thus, the domains are not arrayed in predetermined orientations, but are in random orientations.

Finally, a package process of post mold curing (PMC) is carried out for curing a molding compound, step 207, and next, a package level function test is performed on the packaged devices, step 209, to determine whether their electrical performance falls within specification. In this test, test signals are applied to the devices through the input pins of the packages, which are connected internally to the input/output pads of the test circuit. After this, the manufacturing process of the memory devices is completed, step 211.

Figure 2A:
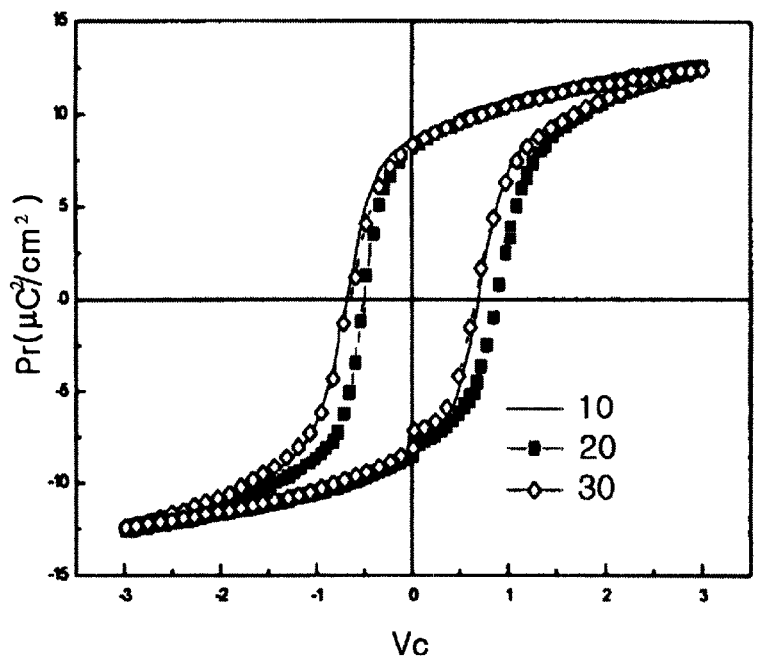
FIGS. 2A and 2B are hysterisis loop curves of polarization versus applied voltage before and after Curie temperature annealing.
Figure 2B:
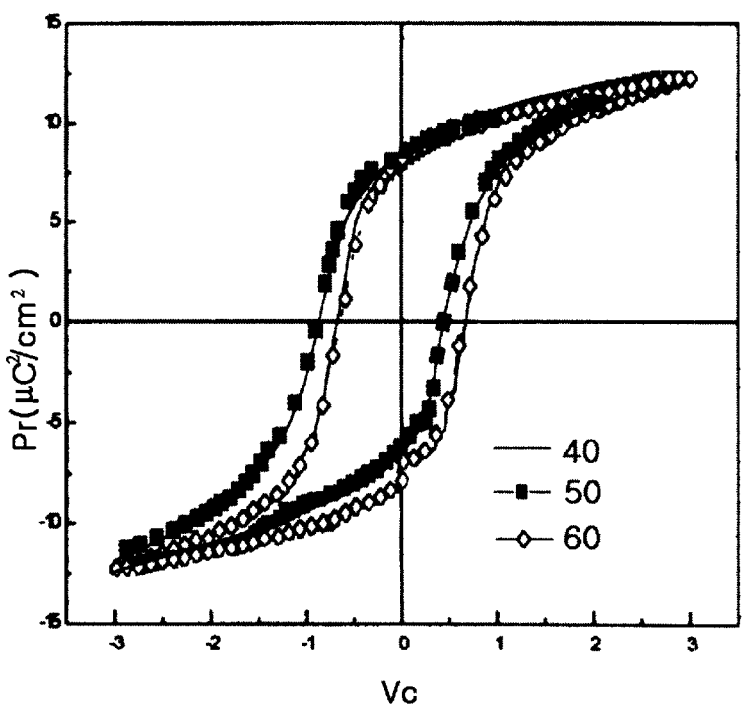

Referring to FIGS. 2A and 2B, there are shown two graphs of hysterisis loop curves setting forth a negative polling state and a positive polling state of the memory cell, respectively.

In FIG. 2A, after the wafer level function test, the ferroelectric may have a negative polling state at an initial state, which is denoted reference numeral 10. But when this is experienced in the package process without Curie temperature annealing, the polling state of FeRAM device is changed, i.e., the graph is shifted to the right as denoted by reference numeral 20. The change of the graph means that the switching charge and critical voltage are changed to degrade the reliability of the device and finally, the device fails. Meanwhile, reference numeral 30 denotes the P-V curve of the device which experiences the package process after Curie temperature annealing. In this graph, it is understood that there is no change of hysterisis loops before and after the package process.

In FIG. 2B, similar to FIG. 2A, when the device experiences the package process, the P-V curves are changed from the initial state 40 into a deteriorated state 50. But, when the device has undergone Curie temperature annealing after the wafer level function test, the graph remains unchanged.

As described already, the present invention provides a solution for the retention problem of the FeRAM device by carrying out the Curie temperature annealing process after the wafer level test and before the package process.

In accordance with an embodiment of the present invention, the annealing process is a supplementary process in comparison with that of the prior art. But when making use of the conventional process of drying an ink mark which indicates "pass/fail" of the device after the wafer level function test, the supplementary annealing process is not required. That is, if the ink mark-drying temperature is heated up to the Curie temperature of the ferroelectric material, the annealing process can be carried out simultaneously with the ink mark-drying process.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A method for manufacturing a ferroelectric random access memory (FeRAM) device, the method comprising the steps of:
    a) preparing a memory device provided with transistors and ferroelectric capacitors incorporating therein;
    b) carrying out a wafer level function test to the memory device such that domains of ferroelectric are arrayed in directions to generate an electric field;
    c) annealing the memory device above Curie temperature of a ferroelectric material for arraying domains of the ferroelectric in random orientations; and
    d) carrying out a package process.

2. The method of claim 1, wherein capacitor thin films of the capacitors are made of SBT.

3. The method of claim 2, wherein the step c) is carried out at a temperature ranging from 250° C. to 400° C.

4. The method of claim 1, wherein capacitor thin films of the capacitors are made of PZT.

5. The method of claim 4, wherein the step c) is carried out at a temperature ranging from 350° C. to 500° C.

6. The method of claim 1, wherein the step c) is carried out in inert gas ambient or in atmosphere by using at least one of a rapid thermal anneal (RTA) and a thermal treatment in a furnace.

7. The method of claim 1, wherein the step of annealing is performed simultaneously with an ink mark-drying process up to the Curie temperature.

* * * * *